United States Patent [19]

Drain et al.

[11] Patent Number: 4,826,705
[45] Date of Patent: May 2, 1989

[54] RADIATION CURABLE TEMPORARY SOLDER MASK

[75] Inventors: Kieran F. Drain, Meridan; Robert Summers, Middletown; Larry A. Nativi, Rocky Hill, all of Conn.

[73] Assignee: Loctite Corporation, Newington, Conn.

[21] Appl. No.: 62,756

[22] Filed: Jun. 15, 1987

Related U.S. Application Data

[63] Continuation-in-part of Ser. No. 881,872, Jul. 2, 1986, abandoned.

[51] Int. Cl.$^4$ .................. B05D 3/06; B05D 1/36; B05D 5/00; G03C 1/90
[52] U.S. Cl. .................. 427/54.1; 427/96; 427/259; 427/264; 522/96; 522/99; 522/103; 522/182; 430/256; 430/260
[58] Field of Search .............. 427/54.1, 96, 116, 259, 427/264; 430/258, 256, 260, 261; 522/96, 99, 103, 182

[56] References Cited

U.S. PATENT DOCUMENTS

| | | | |
|---|---|---|---|
| 2,476,937 | 7/1949 | White | 427/116 |
| 3,139,352 | 6/1964 | Coyner . | |
| 3,853,576 | 12/1974 | Netznik . | |
| 3,853,578 | 12/1974 | Suzuki et al. . | |
| 3,989,610 | 11/1976 | Tsukada et al. | 204/159.19 |
| 4,064,287 | 12/1977 | Lipson et al. | 427/96 |
| 4,088,545 | 5/1978 | Supnet | 204/15 |
| 4,120,843 | 10/1978 | Ameen et al. . | |
| 4,246,147 | 1/1981 | Bakos et al. . | |
| 4,254,163 | 3/1981 | Piazza . | |
| 4,283,480 | 8/1981 | Davies et al. | 204/159.19 |
| 4,351,880 | 9/1982 | Fukui et al. . | |
| 4,357,413 | 11/1982 | Cohen et al. . | |
| 4,399,239 | 8/1983 | Herwig et al. | 204/159.19 |
| 4,410,562 | 10/1983 | Nemoto et al. | 427/54.1 |
| 4,438,227 | 3/1984 | Nall et al. . | |
| 4,487,654 | 12/1984 | Coppin | 156/645 |
| 4,514,713 | 4/1985 | Van Dam | 427/58 |
| 4,528,259 | 7/1985 | Sullivan | 430/312 |
| 4,685,991 | 8/1987 | Herrmann et al. | 430/256 |
| 4,752,346 | 6/1988 | Platzer | 430/256 |

FOREIGN PATENT DOCUMENTS

1447673 3/1969 Fed. Rep. of Germany .
119546 6/1985 Japan .

OTHER PUBLICATIONS

CHR Industries, Inc./an Armco Company, temp-r-tape for printed circuit protection, undated pp. 1 and 2.
Chemtronics, Chemask TM Peelable Solder Mask, 1984, pp. 1 and 2.
Chemtronics, Chemask ® W, Technical Bulletin, 1986, p. 1.
Technical Information Sheet, Coates Circuit Products/U.S.A. Peelable Resist Blue XZ 78, 2/86, pp. 1 & 2.
Amicon, Technical Data, Amicon LV 2630-8, Ultraviolet Light Curing Developmental Product.
Chemtronics, Chemask TM S, Solvent Soluble Masking Agent, 1985, p. 1.

Primary Examiner—Norman Morgenstern
Assistant Examiner—Marianne Padgett
Attorney, Agent, or Firm—Vidas & Arrett

[57] ABSTRACT

A composition and method for providing temporary masking of electrical and electronic components compatible with a high speed production operation. The composition is a radiation curable viscous liquid composition which provides minimal adhesion properties and substantial cohesive properties so that when cured, it can be readily removed in the manner of an adhesive tape. In particular, the radiation curable composition is characterized by cured properties a) of positive adhesion to the substrate to which the composition is applied, but insufficient adhesion to resist peeling forces applied by hand; and b) of sufficient cohesive strength to allow substantially all of the cured composition to be stripped mechanically or by hand in a single piece. Suitably the adhesion of the cured composition (22) to the substrate (16) as measured in the tensile shear mode, is between about 5 and 55 psi. This level of adhesion is sufficient to prevent ingress of solvent solder, plating or coating materials but low enough to allow easy dry stripping mechanically or by hand.

15 Claims, 1 Drawing Sheet

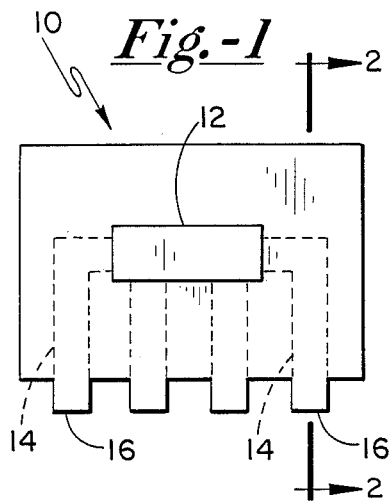
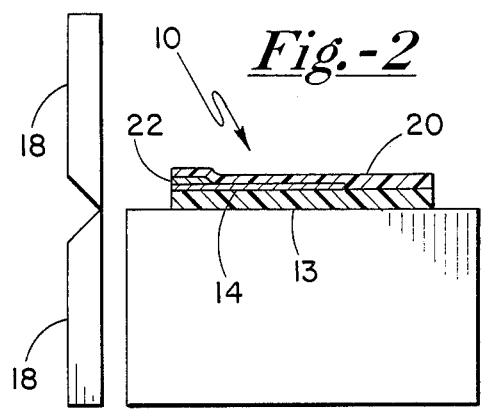
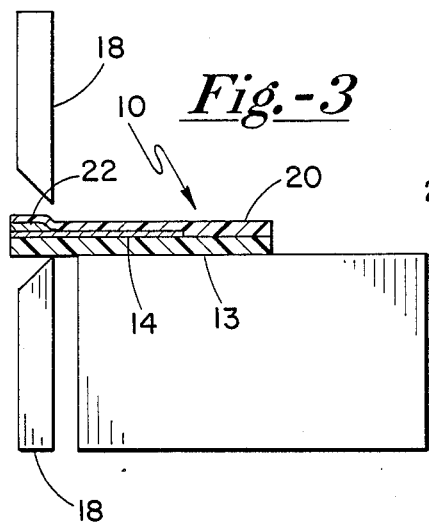
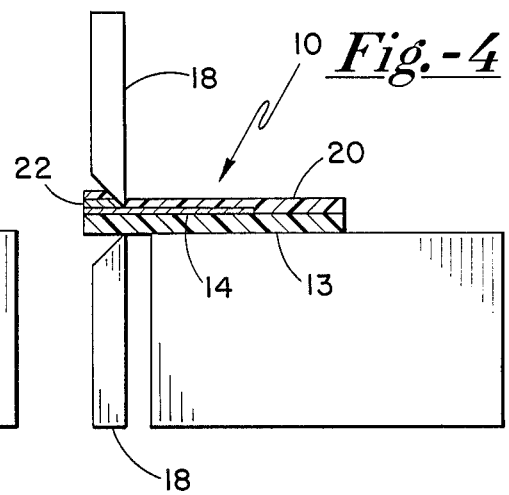
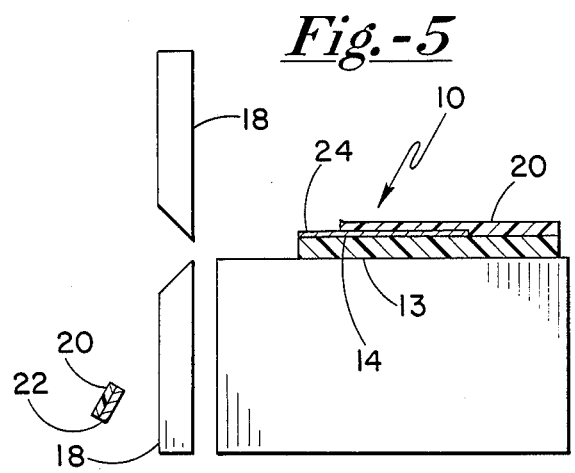

RADIATION CURABLE TEMPORARY SOLDER MASK

This application is a continuation-in-part of co-pending application Ser. No. 881,872, filed July 2, 1986 now abandoned.

BACKGROUND OF THE INVENTION

1. Field of the Invention

This invention relates to a method of providing temporary masking on electrical/electronic components and to compositions utilized in said method. Such compositions are photopolymerizable producing coatings with limited adhesive properties such that they provide a measure of adhesion sufficient to withstand component processing but insufficient to prevent easy mechanical removal of the coating. Typical applications include, but are not limited to, masking specific areas of printed circuit boards during soldering, plating or conformal coating operations.

2. Background Art

Heretofore, methods of providing printed circuit board protection have been limited to tape products and evaporative coatings.

The tape products as exemplified by Temp-R-Tape M727 and M737 from CHR Industries, Inc., are used by cutting to size and manually applying the tapes to the board. As such, these products do not lend themselves to automation and require a high level of labor input. Removal of the tapes is most often by peeling, although several water or solvent soluble versions are available on the market.

Evaporative products are typified by the masks available from Chemtronics, Inc., e.g., Chemask W, Chemask S, and Chemask Peelable. Such products are latex based and are applied to circuit boards as low viscosity liquids. Following board processing, the mask is removed from the board by peeling or washing in water or freon depending upon the grade. While it is possible to automatically apply such products to circuit boards, the long drying time required before a board can be further processed prohibits their use in high speed non-labor intensive production situations.

While photopolymerizable temporary masks are known in the electronics industry, their use has been as process aids in the development of permanent resists and polymer inner layers. It has never before been proposed to utilize a liquid photopolymerizable resist which can be mechanically stripped after photopolymerization.

SUMMARY OF THE INVENTION

Accordingly, it is an aspect of the present invention to provide a composition and method for providing temporary masking of electrical or electronic components compatible with a high speed production operation. The composition is a radiation curable viscous liquid composition which provides minimal adhesion properties and substantial cohesive properties so that when cured, it can be readily removed in the manner of an adhesive tape. In particular, the radiation curable composition is characterized by cured properties (a) of positive adhesion to the substrate to which the composition is applied, but insufficient adhesion to resist peeling forces applied by hand; and (b) of sufficient cohesive strength to allow substantially all of the cured composition to be stripped mechanically or by hand in a single piece. Suitably the adhesion of the cured composition to the substrate as measured in the tensile shear mode, is between about 5 and 55 psi. This level of adhesion is sufficient to prevent ingress of solvent solder, plating or coating materials but low enough to allow easy dry stripping mechanically or by hand.

In general, the process for providing temporary protection comprises applying the compositions of the invention to the areas to be masked. Exposing such areas to actinic radiation to produce a dry coating which is resistant to debonding during soldering, plating, or cleaning operations but which can be readily peeled from the substrate after all necessary processing has been completed.

An aspect of the invention is a method for providing a conformally coated circuit board having at least one discreet uncoated conductive connector area, the method comprising providing a uncoated circuit board having said conductor area, applying a temporary mask formulation as described above to said connector area, overcoating the entire board, including the masked connector areas, with a UV curable conformal coating composition, irradiating the board to cure the conformal coating and temporary mask and stripping the mask mechanically or by hand from said connector area.

A further aspect of the invention comprises a method of temporarily masking a portion of a electronic component (such as a circuit board or a component on a circuit board) which is to be subjected to subsequent processing operations, such as plating, soldering, and cleaning operations, the method comprising applying a mask composition as previously described to said portion of said electronic component, irradiating to cure the mask composition, performing the said subsequent processing operation and then stripping the cured mask mechanically or by hand from said portion of said electronic component.

It should be understood that the mechanical or hand peeling step is a dry stripping step, that is, neither solvents, solvent vapors nor developer solutions are needed to accomplish the stripping of the cured mask.

BRIEF DESCRIPTION OF THE DRAWINGS

FIG. 1 is a top plan view of a conformally coated electronic printed circuit board having conductive tabs overcoated with both the temporary mask formulation and the conformal coating.

FIGS. 2–5 show a side sectional view of the board as taken along line 2—2 of FIG. 1 as the board is moved in a clamping machine which removes the cured temporary mask and overlying coating from the connector tabs of the board to expose the underlying conductive surfaces.

DETAILED DESCRIPTION OF THE INVENTION

The method of the invention is described above.

The compositions utilizable in the invention can be formulated in a number of ways, including using monomers such as vinyl stearate in radiation curable formulations to reduce the adhesion normally obtained and using high levels of plasticizer or filler for the same purpose. Examples of radiation curable formulations include those based on acrylic monomers; unsaturated polyesters; thiol-ene formulations, and formulations based on other vinyl monomers such as N-vinyl pyrrolidone; N-vinyl carbazole; vinyl acetate; styrene; etc. Most suitably, the radiation curable formulations contain a predominant amount of an acrylic capped prepolymer such as an acrylated or methacrylated polyester urethane; an acrylate or methacrylate capped polybutadiene urethane; an acrylate or methacrylate ester prepared by reaction of (meth)acrylic acid with a polyepoxide resin; a (meth)acrylate terminated butadiene polymer such as Hycar ® VTB or VTBN; or an acrylate or methacrylate capped silicone.

Unlike the prior use of radiation cured resist materials in electronics assembly operations, the invention herein requires that the composition only produce minimal adhesion, sufficient to resist ingress by solder, coating or plating materials during application and processing operations, but insufficient to resist hand peeling. By formulating compositions to these specifications, the applicants herein have discovered that substantial improvements in automating the assembly of electronic parts can be obtained. In particular, the formulations can be dispensed and cured with a few minutes in an automated process, eliminating the need for hand application of tapes or long dry times for latex formulations. The cost advantages in automating this operation are sufficient to overcome the substantially higher cost of the monomer formulations themselves over tapes or latexes.

The preferred formulations of the invention also have sufficient cured cohesive strength for substantially all of the cured material to be peeled off in one piece. Additionally, they are preferably curable within 5 seconds on exposure of 365 nm UV light of an intensity of at least 20,000 $\mu W/cm^2$.

Although adhesion must be low, the cured product must be able to standup to highly stressful environments including:

(1) Wave soldering, or vapor phase soldering i.e. immersion in molten solder 525° F. 10-30 seconds, or exposure to Fluorinert TM vapor 425° F. 10-30 seconds. This property is relevant to non-conformal coating related circuit board masking.

(2) Solvent cleaning with solvents such as Freon TM TMS or Fluorinert TM. This property is relevant to component masking.

(3) High temperature exposure, e.g. 300° F. for 30 minutes. This property is relevant to where the transformer is coated with a heat curing varnish.

Several strategies can be used to formulate a temporary mask composition of the invention with the requisite low adhesion and relatively high cohesive strengths. Typically a conventional acrylic based UV curable composition which produces a flexible tough film will be modified by addition of one or more comonomers which have very poor adhesive properties. Vinyl esters of saturated oil acids, such as vinyl stearate or vinyl palmitate, and acrylic esters of saturated hydrocarbons ($C_{10}$ or greater) or of poly(alkylene oxide)s having three or more alkoxy repeat units, such as ethoxyethoxyethyl acrylate, will be employed to reduce adhesion of the composition. Plasticizers which will not leave a residue on the substrate circuit board when the cured mask is stripped off may also (or alternatively) be incorporated into the formulation to reduce adhesion. Suitably, polymeric plasticizers may be employed as non-migratory plasticizers. As a still further alternative, adhesion may be reduced by loading the composition heavily with filler, such as a fumed silica, to reduce substrate wetting by the composition. This latter alternative, however, is the least preferred as wetting is likely to be highly variable and poor wetting can lead to poor mask performance, permitting ingress of solder, coatings or other subsequent processing materials.

Compositions of the invention are typically highly viscous materials. Suitably they are gel-like materials having viscosities in excess of 100,000 cps, preferably about 300,000–400,000 cps. This high viscosity is in part due to the necessity of using high levels of monomers which are themselves polymers capped with acrylic or vinyl groups in order to produce a formulation having sufficient cohesive strength to be readily peeled from the board surface. Preferably such monomers represent the highest percentage by weight component in the formulation. However, the high viscosity of the formulation provides a processing advantage as well. In particular, it is possible to use the composition as a mask for conformal coating operations even before the mask composition has been cured. After application of the masked composition to the areas of the board to be protected from the conformal coating, the entire board is conformally coated in a spray or dip operation with a UV curable permanent coating formulation. The board is then placed in a UV oven where both the coating and the mask composition are simultaneously cured. The mask can then be peeled off mechanically or by hand, removing the portion of the conformal coating overlying the mask but leaving the coating over the rest of the board intact.

It may be desirable for application purposes to reduce the viscosity with a volatile solvent, for instance, so that the product can be sprayed. Evaporation of the solvent will return the product to its high viscosity, non-migrating character.

Preferred formulations comprise:
50-65% of a (meth)acrylated urethane, a (meth)acrylated polyester urethane, a (meth)acrylated polyepoxide, a (meth)acrylated polybutadiene or mixtures thereof;
10-30% of a monofunctional ethylenically unsaturated diluent monomer;
0-3% of a monomer having plural (meth)acrylic functionality;
0.5-5% of a monomer selected from vinyl esters of saturated oil acids,
0-20% of a poly(alkylene oxide) (meth)acrylate having three or more alkoxy repeat units or a saturated $C_{10}$ or higher hydrocarbyl (meth)acrylate, and 0-10% (preferably 2-6%) of a silica thixotrope.

The compositions may further comprise conventional amounts of stabilizers, fillers, nonreactive diluents, pigments and the like.

Suitable diluent monomers include monomers having single (meth)acrylate or vinyl groups such as tetrahydrofufural methacrylate, hydroxypropyl methacrylate, vinyl acetate, styrene, isobornyl acrylate, N-vinyl pyrrolidone, N-vinyl carbazole, etc. Preferably the diluent monomer is selected from the group consisting of isobornyl acrylate, N-vinyl pyrrolidone and N-vinyl carbazole as formulations using these monomers can be readily cured at lower intensity UV irradiation.

Referring now to the drawings there is shown in FIG. 1 a printed circuit board 10 having a raised electronic component 12 from which extend a series of conductive pins, not shown. The pins are soldered to conductive pads, also not shown, on the board. The board is a laminate, as best shown in FIGS. 2-5, of epoxy glass composite or other insulator which is overlaid with a conductive metal layer. The conductive layer has been etched in image wise manner to provide discrete conductive paths 14 from the individual pins of component 12 to individual connection tabs 16, thereby to provide connection means to the component.

In coating the board 10, there was first applied a layer of the temporary mask formulation of the invention to the connection tabs and then the entire board was coated with a conventional UV curable conformal coating. Most suitably the conformal coating is one which cures by both UV and a secondary moisture or oxidation mechanism such as described in U.S. Pat. Nos. 4,415,604, 4,424,252, and 4,551,523. The board was then irradiated to cure both the temporary mask and the conformal coating formulations. The conformal coating and cured mask are designated by the numerals 20 and 22, respectively in FIGS. 2-5.

After the coating and mask have been fully cured, the conductive surfaces of tab 16 may be easily exposed simply by pulling the coating and mask off in a single piece without the use of solvent. This operation may be done by hand but is more preferably done mechanically as shown in FIGS. 2-5. FIG. 2 shows the coating board in sectional view in a machine for removing the mask and coating from the tab 16. The machine includes a pair of mechanical jaw 18, means not shown for opening and closing the jaws, and means, also not shown, for moving the board under and out from between the jaws. In operation Jaws 18 are opened and the tabs 16 of the board are slid under the jaws (FIG. 3). The jaws are then closed onto the board (FIG. 4) and the board pulled from between the jaws (FIG. 5). The mask and the conformal coating overlying the mask are cleanly stripped from tabs 16 to expose the connection surfaces 24 without damaging the integrity of the conformal coating of the remaining portion of the board.

Other applications of the temporary mask are as a temporary sealant for protecting electronic components from subsequent soldering or vapor cleaning operations and as a mask for connector pins of a transformer assembly prior to unitizing the wire winding of the transformer with a lacquer or varnish formulation.

Vapor cleaning of circuit boards utilizes aggressive solvents, such as Freon TM TMS and Fluorinert TM, which can damage some components soldered on the board, particularly unsealed components such as dip switches and adjustable potentiometers. Such components can be protected by temporarily sealing the component with a layer of cured temporary mask formulation (e.g. over dip switch lever members). Alternatively, in an improvement over a conventional procedure, preformed polyethylene caps may be bonded over the component using a temporary mask formulation of the invention in place of the conventionally used solvent based adhesives. The temporary mask will cure through polyethylene so the formulation can be fully cured both inside and outside the cap.

The invention will be better illustrated by reference to the following non-limiting examples, it being understood that a skilled person can readily formulate other radiation curable compositions useful in the inventive method with reference to his own formulation skill and the desired property parameters set forth herein.

EXAMPLE 1

The composition of Table I was applied to the connector fingers of a printed circuit board. The circuit board was then spray coated with a conformal coating (Loctite Product 361). Both materials were cured simultaneously by exposure to ultraviolet radiation, 365 nm 70,000 $\mu W/cm^2$, for 10 seconds. Subsequent to curing, the cured mask was readily removed by peeling, exposing an area of the board free from a conformal coating which would interfere with the electrical performance of the unit.

TABLE I

|  | % Wt. |
|---|---|
| Acrylated polyester urethane (Morton Thiokol Urithane 782) | 40.53 |
| Acrylated polyester urethane (Morton Thiokol Urithane 783) | 13.08 |
| N—vinyl pyrrolidone | 24.97 |
| Trimethylolpropane ethoxylate triacrylate | 2.00 |
| 1-Benzoyl cyclohexanol | 3.00 |
| Vinyl Stearate | 1.75 |
| Pigment red 57 | 0.01 |
| Silicon dioxide | 4.00 |
| Polyester plasticizer (Plasthall P670 CP Hall) | 10.00 |
| Metal Chelator (9% NA EDTA Soln) | 0.70 |

EXAMPLE 2

The composition of Table II was applied to a number of plated through holes on a circuit board which had been populated with a variety of insertion mounted devices. The board was irradiated for 5 seconds at 70,000 $\mu W/cm^2$, 365 nm, to fully cure the mask. The board was then run through the soldering process so fixing these components permanently on the board. Subsequent to this process, the cured mask was easily peeled off the board revealing no solder contamination of the masked areas.

TABLE II

|  | % Wt. |
|---|---|
| Acrylated polyester urethane (Morton Thiokol Urithane 782) | 50.99 |
| Acrylated polyester urethane (Morton Thiokol Urithane 783) | 14.99 |
| N—vinyl pyrrolidone | 12.39 |
| Ethoxyethoxyethyl acrylate | 12.39 |
| 1-Benzoyl cyclohexanol | 2.83 |
| Vinyl stearate | 1.75 |
| Silicon dioxide | 4.00 |
| Pigment red 57 | 0.05 |
| Metal Chelator (9% Na EDTA Soln) | 0.66 |

EXAMPLE 3

The composition of Table 1 was applied to steel hex button substrates. The buttons were overlaid with (i) glass plates 2"×2"×0.25" and (ii) with FR4 epoxy-glass fiber laminate plaques 3"×3" 0.15". Irradiation through the top plate for (i) 10 seconds and (ii) 60 seconds, 365 nm 70,000 $\mu W/cm^2$ fully cures the mask composition. In all cases off-torque values recorded were less than 50 psi.

A value of ≦55 psi has been found to guarantee easy removal of the mask from circuit board connector fingers by automatic equipment operating in a tensile shear mode.

EXAMPLE 4

The composition of Table II was applied to the connector fingers of a printed circuit board. The circuit board was then conformally coated (with Loctite Product 361). Both materials were cured simultaneously by exposure to ultraviolet radiation, 365 nm 70,000 μW cm² for 10 seconds.

Subsequent to curing, the cured mask was removed in an automated assembly operation by inserting the edge connector between hydraulically operated steel jaws, and withdrawing the board against the action of the closed jaws. This process is better understood by reference to FIGS. 2-5.

This example illustrates that this new masking method allows this masking operation to be totally automated with automatic dispensing, curing and removal.

EXAMPLE 5

The test of Example 3 was repeated except that cure conditions for both the steel to glass and steel to FR4 epoxy-glass fiber laminate were 10 seconds. Two formulations were used, Loctite FMD 57, a circuit board conformal coating formulation of the type described in U.S. Pat. No. 4,451,523, and a composition as in claim 1. Table III gives the results of the test. The cured Loctite FMD 57 formulation cannot be peeled from a clean circuit board without use of solvents.

TABLE III

Adhesive Properties of Permanent vs. Temporary Peelable Mask
ASTM No. D-3658
Cure Conditions 10 Sec. 100,000 μWcm⁻² 365 nm

| Product | Steel hex button to glass | Steel hex button to FR4 epoxy glass |
|---|---|---|
| FMD 57 | 420 in lb⁻¹ | 85 in lb⁻¹ |
| Composition of Example 1 | 30 in lb⁻¹ | 14 in lb⁻¹ |

EXAMPLE 6

Polyethylene and Valox TM, the conventional housing material for dip switches and the like, are very low energy plastics and satisfactory adhesion to these materials (i.e. in the 5-about 50 psi range) may require a formulation which provides somewhat higher adhesion to other materials than those previously described. A suitable formulation which cured is resistant to aggressive solvents and can readily be peeled from circuit boards or Valox TM dip switch housings is shown in Table IV.

TABLE IV

Component Mask Composition

| Ingredient | % |
|---|---|
| Acrylate Urethane Resin (Interez CMD8850 - 20R) | 63.27 |
| Isobornyl acrylate | 15.77 |
| Ethoxyethoxyethyl acrylate (Morton Thiokol RC20) | 15.77 |
| 1-Benzoyl cyclohexanol | 2.83 |
| Vinyl stearate | 1.65 |
| Butyrated hydroxy toluene | 0.71 |
| | 100.00 |

Table V compares the adhesive properties of the Table IV composition and the composition described in Example 1. It can be seen that greater adhesion is necessary to provide sufficient bonding on difficult to bond plastics such as the Valox TM switch over that required to bond to gold plated connectors tin plated through holes. The adhesive properties are still less than that shown in Table III for the permanent conformal coating and allow easy mechanical removal from the board.

TABLE V

Adhesive Performance of Component and Circuit Board Masks. ASTM No. D 3658
Cure Conditions 10 Sec. 100,000 μWcm⁻² 365 nm

| Composition | Steel hex button to glass | Steel hex button to FR4 epoxy glass |
|---|---|---|
| Circuit Board Mask Composition 1 Example 1 | 30 in lb⁻¹ | 14 in lb⁻¹ |
| Component Mask Composition Table II | 144 in lb⁻¹ | 52 in lb⁻¹ |

Table VI illustrates the weight change of the cured composition of Table IV when exposed to Fluorinert immersion 90° C., for 8 minutes.

No significant weight change was observed indicating the suitability of the mask composition. Seal integrity is ensured (no Fluorinert TM absorption) and no uncured residue is left on the component to be masked (no significant weight loss indicative of extraction of uncured residue).

TABLE VI

Wt loss/gain on Fluorinert Exposure

| Initial Wt. | Wt. After exposure | Wt. Change | % Wt Change |
|---|---|---|---|
| 6.9568 gms | 6.9467 gms | −0.0101 | −0.145 |

EXAMPLE 7

The composition of Table IV was applied to the top part of a DIP switch Model No. 765B08 from Grayhill Corp., Chicago, Ill. The mask was cured by irradiation for 5 seconds at 100,500 μW cm⁻² 365 nm. After curing the integrity of the seal was tested by immersion in agitated Fluorinert TM (3M Co.) at 90° C. for 8 minutes. Seal integrity was perfect as evidenced by the lack of air bubble emissions from the switch. The switch mask was then removed by manually peeling from the plastic housing. In practice the mask is not removed until the switch is inserted into a printed circuit board and wave soldered. The mask prevents solder flux and cleaning solvents from entering the inner compartment of the D.I.P. switch.

What is claimed is:

1. A temporary mask composition for use in operations for manufacturing electrical or electronic parts, the composition comprising:
   (a) a radiation curable monomer formulation including a predominant amount of acrylic end capped prepolymer,
   (b) a radical photoinitiator, and
   (c) an adhesion reducing component selected from the group consisting of polymeric plasticizers and acrylic esters of saturated fatty alcohols, vinyl esters of saturated fatty acids, monoacrylic esters of polyalkylene oxides, and mixtures thereof, in an amount sufficient to reduce the tensile shear adhesion of said composition when cured to the said electronic or electrical part to about 55 psi or less, said composition further characterized by sufficient cohesive strength to permit the cured composition to be peeled from said substrate mechanically or by hand in substantially one piece.

2. A composition as in claim 1 wherein said composition is further characterized by a viscosity of at least about 100,000 cps.

3. A composition as in claim 1 wherein said acrylate end capped prepolymer is selected from the group consisting of an acrylated or methacrylated polyester urethane; an acrylate or methacrylate capped polybutadiene urethane; an acrylate or methacrylate ester prepared by reaction of (meth)acrylic acid with a polyepoxide resin; a (meth)acrylate terminated polybutadiene and an acrylate or methacrylate capped silicone.

4. A composition as in claim 1 wherein the composition comprises by weight;
   50–60% of a (meth)acrylate urethane, a (meth)acrylated polyester urethane, a (meth)acrylated polyepoxide a (meth)acrylated polybutadiene or mixtures thereof;
   10–30% of a monofunctional ethylenically unsaturated diluent monomer;
   0–3% of a monomer having plural (meth)acrylic functionality;
   0.5–5% of a monomer selected from vinyl esters of saturated oil acids;
   0–20% of a poly(alkylene oxide) (meth)acrylate having three or more alkoxy repeat units or a saturated $C_{10}$ or higher hydrocarbyl (meth)acrylate, and
   0–10% of a silica thixotrope.

5. A composition as in claim 4 wherein the monofunctional ethylenically unsaturated diluent monomer is selected from the group consisting of N-vinyl pyrrolidone, N-vinyl carbazole, and isobornyl acrylate.

6. A composition as in claim 4 wherein the vinyl ester of a saturated oil ester is vinyl stearate.

7. A composition as in claim 4 wherein the composition includes 2–6% of a silica thixotrope.

8. A composition as in claim 1 further comprising a polymeric plasticizer in an amount of up to 20% by weight.

9. A composition as in claim 8 where the polymeric plasticizer is present in an amount of about 10% and is a polyester plasticizer.

10. A method of conformally coating circuit board having uncoated contact members thereon comprising applying a temporary mask composition as in claim 2 to said contact members; coating the entire board, with a radiation curable conformal coating formulation; irradiating the board to cure both the temporary mask and conformal coating formulations; and, removing the cured mask and the conformal coating overlying said mask by mechanically or hand peeling said mask without use of solvents or developer solutions.

11. In a method of manufacturing a transformer comprising assembling a transformer including a wire winding and a plurality of connector pins for providing electrical connection to the transformer and subsequently unitizing the assembly by spraying a lacquer or varnish over the wire winding, the improvement comprising coating the said connector pins with a mask composition as in claim 1 and irradiating the assembly to cure said composition prior to said unitizing operation and, after said unitizing operation, mechanically stripping the cured mask from the connector pins.

12. A method for providing a temporary mask on a substrate, the method comprising applying a coating layer of a liquid radiation curable composition to the areas of the substrate to be masked and irradiating the composition with actinic light for sufficient time to cure the composition, wherein the composition is characterized by cured properties (a) which provide adhesion to the substrate which is sufficient to prevent ingress of solder, plating or cleaning materials in subsequent soldering, plating or cleaning operations, but which is insufficient to resist hand peeling forces; and (b) which provide sufficient cohesive strength to the coating layer to allow substantially all of the layer to be peeled off mechanically by hand in a single piece.

13. A method as in claim 12 wherein the said substrate is a printed circuit board.

14. A method as in claim 13 wherein the said subsequent operation is a wave soldering operation, said method further comprising mechanically removing the mask after the wave soldering operation and inserting and hand soldering a thermally sensitive component to the areas of the board exposed when the mask was removed.

15. A method as in claim 12 wherein the said substrate is a dip switch component and said composition is applied over openings therein so as to seal the interior of the switch from circuit board cleaning solvents when cured.

* * * * *

UNITED STATES PATENT AND TRADEMARK OFFICE
CERTIFICATE OF CORRECTION

PATENT NO. : 4,826,705

DATED : May 2, 1989

INVENTOR(S) : Kieran, Drain et al

It is certified that error appears in the above-identified patent and that said Letters Patent is hereby corrected as shown below:

Col. 10, line 31, after "mechanically" insert - or -

Signed and Sealed this

Ninth Day of January, 1990

Attest:

JEFFREY M. SAMUELS

*Attesting Officer*    *Acting Commissioner of Patents and Trademarks*